(12) United States Patent
Krishna

(10) Patent No.: US 9,979,383 B2
(45) Date of Patent: May 22, 2018

(54) DELAY COMPENSATED CONTINUOUS TIME COMPARATOR

(71) Applicant: TEXAS INSTRUMENTS INCORPORATED, Dallas, TX (US)

(72) Inventor: Kannan Krishna, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/220,225

(22) Filed: Jul. 26, 2016

(65) Prior Publication Data

US 2018/0034453 A1 Feb. 1, 2018

(51) Int. Cl.
*H03K 5/153* (2006.01)
*H03K 5/24* (2006.01)
*H03K 5/00* (2006.01)

(52) U.S. Cl.
CPC ..... *H03K 5/24* (2013.01); *H03K 2005/00091* (2013.01)

(58) Field of Classification Search
CPC .............. H03K 5/24; H03K 2005/00091
See application file for complete search history.

(56) References Cited

U.S. PATENT DOCUMENTS

| | | | | |
|---|---|---|---|---|
| 3,835,399 A * | 9/1974 | Holmes | ............. | H03H 11/1252 327/555 |
| 4,121,121 A * | 10/1978 | Gabeler | ............. | G06K 9/38 327/58 |
| 4,785,252 A * | 11/1988 | Fuji | ............. | G11B 20/10009 327/72 |
| 5,099,146 A * | 3/1992 | Miki | ............. | H03K 5/086 327/362 |
| 5,382,848 A * | 1/1995 | Burns | ............. | H03K 5/086 327/18 |
| 5,661,423 A * | 8/1997 | Mizuhara | ............. | H03K 5/02 327/307 |
| 6,653,992 B1 * | 11/2003 | Colbeth | ............. | H04N 5/357 327/52 |
| 8,618,848 B1 * | 12/2013 | Chee | ............. | H03K 4/063 327/131 |
| 8,773,170 B2 * | 7/2014 | Williams | ............. | G05F 1/561 327/103 |

* cited by examiner

*Primary Examiner* — Kenneth B Wells
(74) *Attorney, Agent, or Firm* — Tuenlap D. Chan; Charles A. Brill; Frank D. Cimino

(57) ABSTRACT

A delay compensated comparator circuit is disclosed. The circuit includes an amplifier circuit having a first input terminal coupled to receive a reference signal and having a second input terminal and a first output terminal. A capacitor is arranged to couple an input signal to the second input terminal. A resistor is coupled between the first output terminal and the second input terminal. A comparator circuit has a third input terminal coupled to receive the input signal, a fourth input terminal coupled to the first output terminal, and a second output terminal.

14 Claims, 5 Drawing Sheets

DELAY COMPENSATED CONTINUOUS TIME COMPARATOR

BACKGROUND OF THE INVENTION

Embodiments of the present invention relate to a delay compensated continuous time comparator for integrated circuit applications.

Continuous time comparators are used to indicate when one input signal is equal to another input signal. However, because of the delay through the comparator, this equality is indicated by the comparator output signal after the condition has passed. This produces an error in signal comparison where the continuous time comparator is employed. Referring to FIG. 1, there is a diagram of a continuous time comparator of the prior art. FIG. 2 is a diagram showing inherent error of the comparator of FIG. 1, where the horizontal axis is time and the vertical axis is voltage. The comparator output signal Vcomp is initially low. Reference voltage Vref is relatively constant and is applied to the negative input of the comparator. Input signal Vin is applied to the positive input of the comparator. As Vin exceeds Vref the comparator output signal Vcomp goes from low to high. This transition occurs when input signal Vin is equal to reference voltage Vref+Td*dVin/dt, where Td is the delay time of the comparator and dVin/dt is the time derivative or slope of Vin when it is equal to Vref. Thus, the low-to-high transition is delayed with respect to the actual crossing time by delay time Td. In addition, at the time of the Vcomp transition Vin is greater than Vref by error voltage Verr. Thus, the continuous time comparator of the prior art produces errors in time and in voltage.

FIG. 3 is a simulation of a typical comparator of the prior art showing voltage and timing errors, where the horizontal axis is time and the vertical axis is voltage. The comparator output signal Vcomp in the lower diagram is initially low. Reference voltage Vref in the upper diagram is relatively constant at 1.35 V and is applied to the negative input of the comparator. Input voltage Vin is applied to the positive input of the comparator as in FIG. 1. The comparator output signal Vcomp begins a low-to-high transition at 350 ns as Vin approaches Vref. Vin crosses Vref at 375 ns, but Vcomp is not detected until 386 ns when it reaches 0.9 V. By this time, however, the Td error delay is 11.32 ns and the Verr error voltage is 41 mV.

In view of the foregoing problems, embodiments of the present invention are directed to voltage and timing errors in a continuous time comparator circuit.

BRIEF SUMMARY OF THE INVENTION

In a preferred embodiment of the present invention, a delay compensated comparator circuit is disclosed. The circuit includes an amplifier circuit having a first input terminal coupled to receive a reference signal and having a second input terminal and a first output terminal. A capacitor is arranged to couple an input signal to the second input terminal. A resistor is coupled between the first output terminal and the second input terminal. A comparator circuit has a third input terminal coupled to receive the input signal, a fourth input terminal coupled to the first output terminal, and a second output terminal.

DETAILED DESCRIPTION OF THE INVENTION

Preferred embodiments of the present invention provide significant advantages over continuous time comparator circuits of the prior art as will become evident from the following detailed description.

Figure 1:
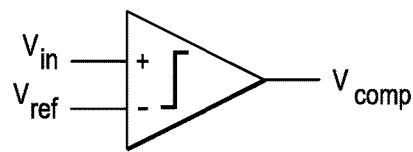
FIG. 1 is a diagram of a continuous time comparator of the prior art.
Figure 2:
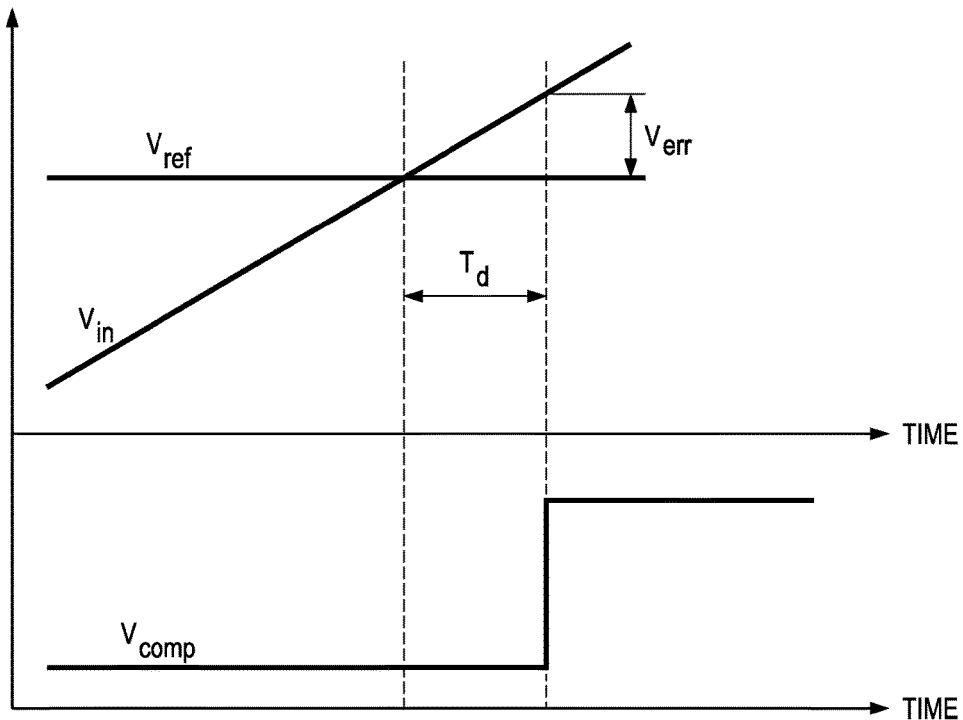
FIG. 2 is a timing diagram showing operation and inherent error of the comparator of FIG. 1.
Figure 4:
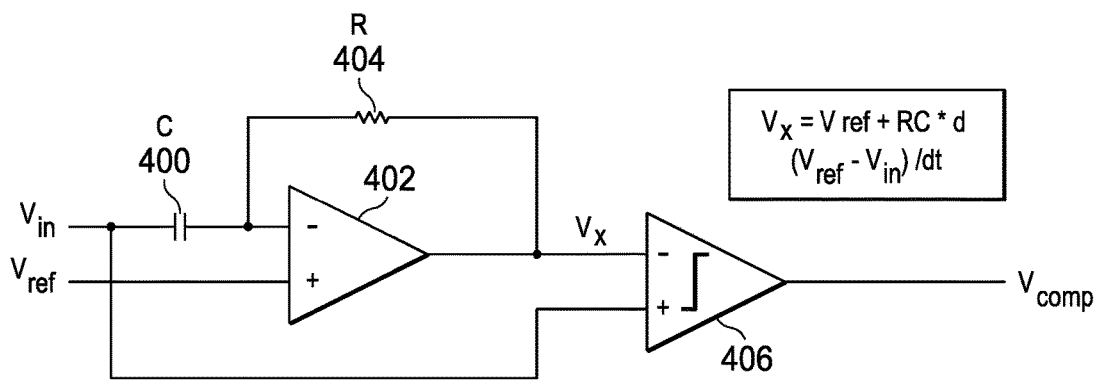
FIG. 4 is a schematic diagram of an embodiment of a continuous time comparator circuit of the present invention.
Figure 3:
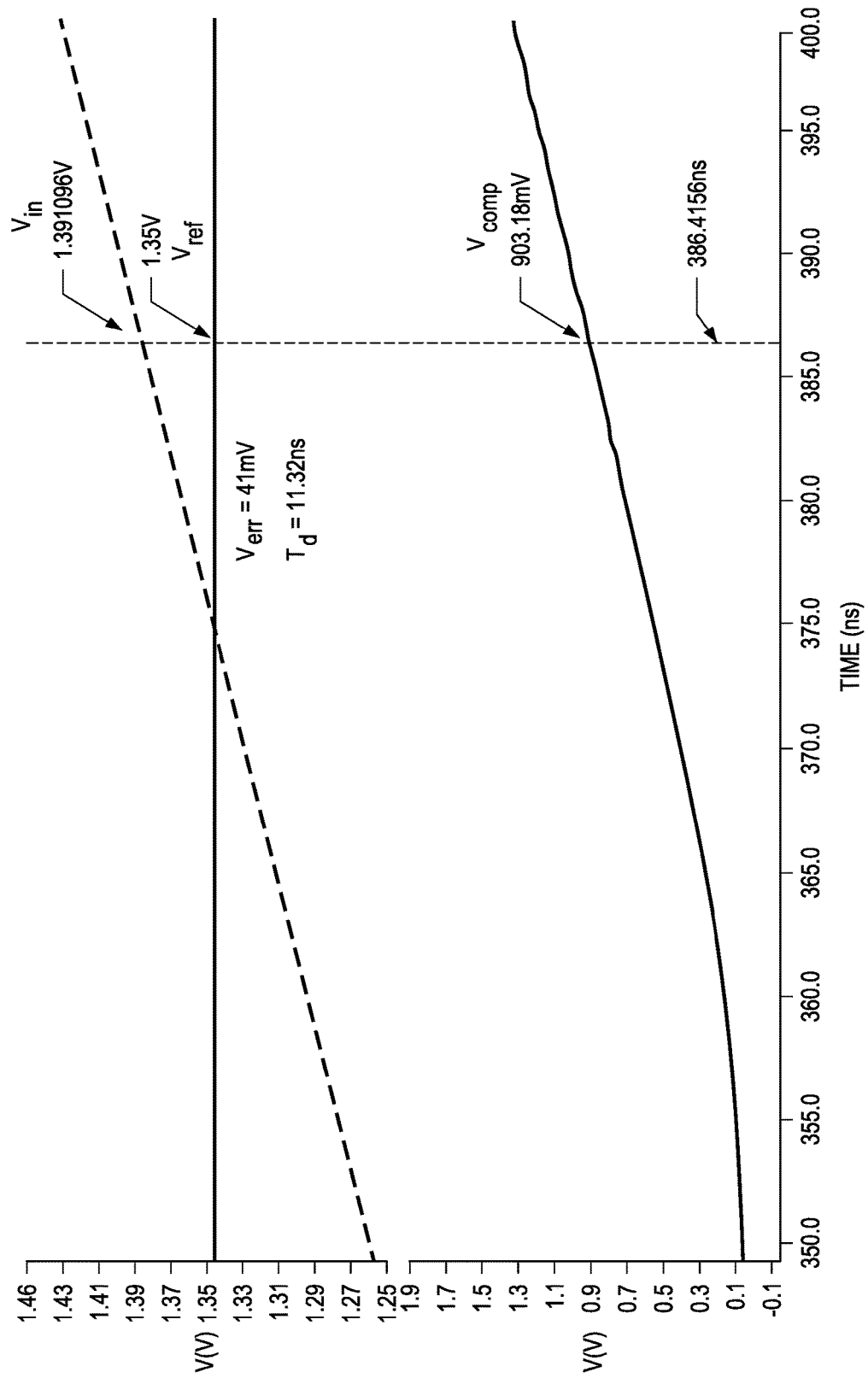
FIG. 3 is a simulation of a typical comparator of the prior art showing voltage and timing errors.

Referring to FIG. 4, there is a schematic diagram of an embodiment of a continuous time comparator circuit of the present invention. The comparator circuit includes an amplifier 402 coupled to receive reference signal Vref at a positive input terminal. A capacitor 400 is arranged to couple input signal Vin to a negative input terminal of amplifier 402. Resistor 404 is coupled between an output terminal and the negative input terminal of amplifier 402. Amplifier 402 produces a look ahead reference signal Vx that is applied to a negative input terminal of a comparator 406. A positive input terminal of comparator 406 is coupled to receive input signal Vin. Comparator 406 produces output signal Vcomp in response to input signal Vin and look ahead reference signal Vx.

In operation, a transition detection threshold of comparator 406 occurs when input signal Vin is equal to Vx+Td*dVin/dt, where Td is the delay time of comparator 406 and dVin/dt is the time derivative or slope of Vin when it is equal to Vref. Look ahead reference signal Vx is set equal to Vref+Td*dVin/dt to cancel the voltage and delay time error of conventional comparator circuits. This is accomplished by setting delay circuit RC equal to delay time Td of comparator 406. Thus, Vx=Vref+RC*d(Vref−Vin)/dt. There are several ways to set RC equal to delay time Td. First, the bias current of the comparator may be designed so that the conductivity (gm) of the comparator is inversely proportional to resistor R and use the same capacitance C that determines the comparator delay. Second, RC may be trimmed to match comparator delay Td. This may be in addition to the first option. Third, RC may be calibrated and selectively programmed in nonvolatile memory. Finally, selected values of R and C may be included in circuit simulations to verify accuracy for various operational conditions.

Figure 5:
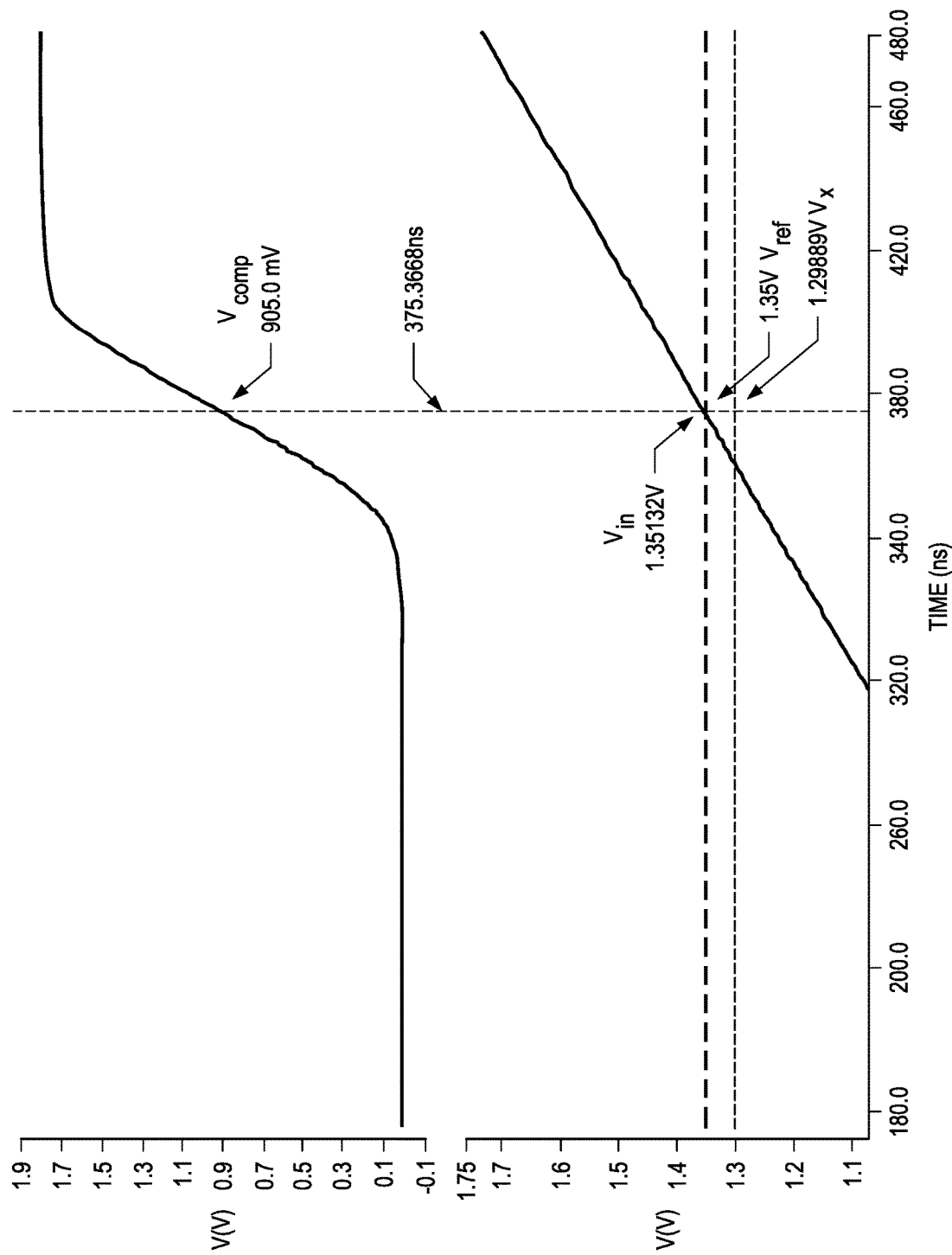
FIG. 5 is a simulation of the continuous time comparator circuit of FIG. 4 for a rising input signal having a positive rate of change with respect to time.

Referring now to FIG. 5, there is a simulation of the continuous time comparator circuit of FIG. 4 for a rising input signal Vin, where the horizontal axis is time and the vertical axis is voltage. The comparator output signal Vcomp in the upper diagram is initially low. Reference signal Vref in the lower diagram is relatively constant at 1.35 V and is applied to the positive input of amplifier 402. Input signal Vin is applied to the negative input terminal of amplifier 402 via capacitor C. Input signal Vin is also applied to the positive input terminal of comparator 406.

Output signal Vx from amplifier 402 is relatively constant at 1.299 V. This look ahead reference signal Vx is approximately 51 mV less than Vref and advantageously cancels the comparator time delay and voltage errors. Thus, output signal Vcomp from comparator 406 is detected at 905 mV when Vin crosses Vref with negligible error.

Figure 6:
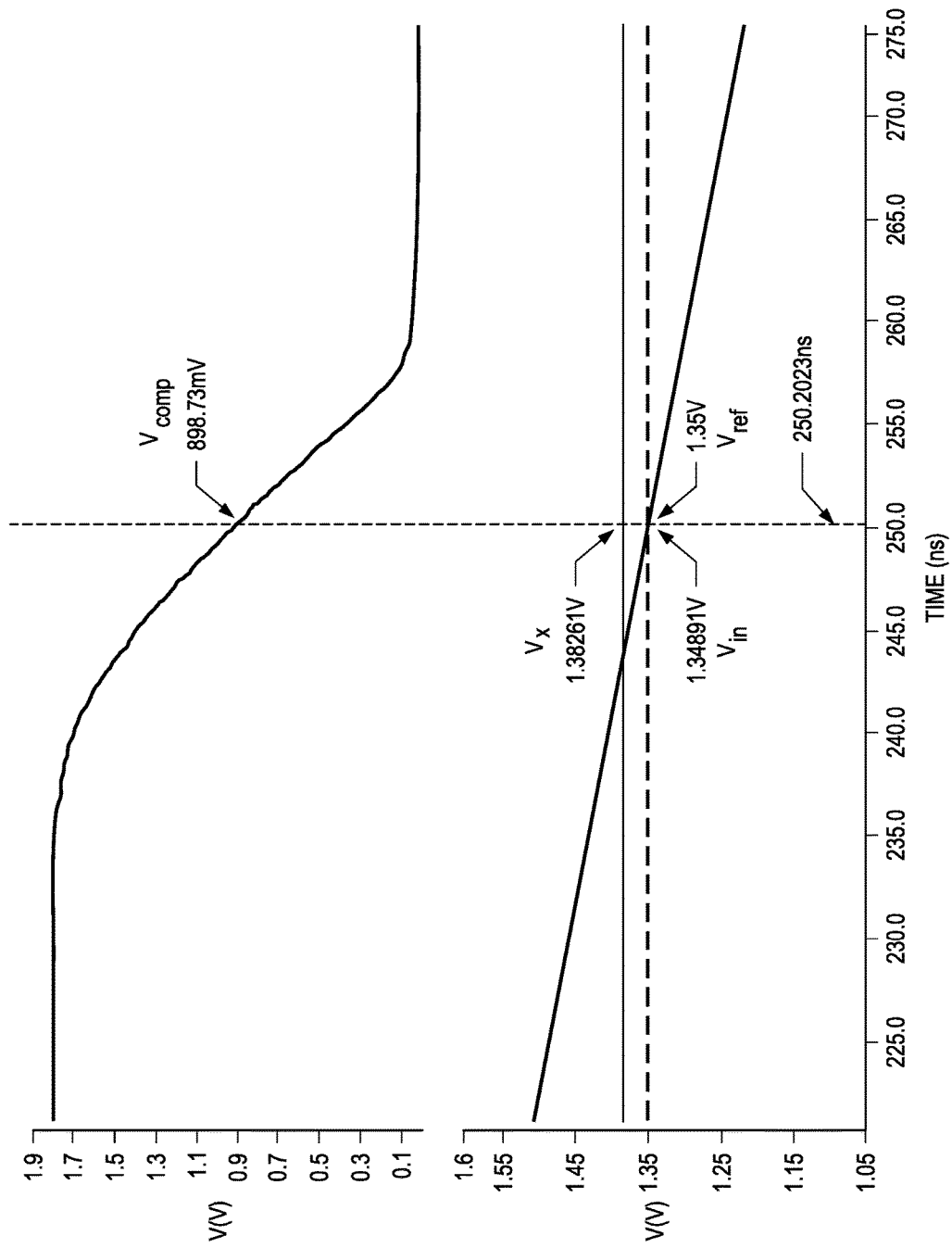
FIG. 6 is a simulation of the continuous time comparator circuit of FIG. 4 for a falling input signal having a negative rate of change with respect to time.

Referring next to FIG. 6, there is a simulation of the continuous time comparator circuit of FIG. 4 for a falling input signal Vin, where the horizontal axis is time and the vertical axis is voltage. The comparator output signal Vcomp in the upper diagram is initially high. Reference signal Vref in the lower diagram is again relatively constant at 1.35 V and is applied to the positive input of amplifier 402. Input signal Vin is applied to the negative input terminal of amplifier 402 via capacitor C. Input signal Vin is also applied to the positive input terminal of comparator 406. Output signal Vx from amplifier 402 is relatively constant at 1.382 V. This look ahead reference signal Vx is approximately 30 mV greater than Vref and advantageously cancels the comparator time delay and voltage errors. Thus, output signal Vcomp from comparator 406 is detected at 898.7 mV when Vin crosses Vref with negligible error.

There are several advantages of this embodiment of the delay compensated comparator circuit of the present invention. First, comparator delay time errors when Vin crosses Vref are cancelled. Comparator output signal Vcomp achieves a mid-point transition detection threshold when input signal Vin is equal to reference voltage Vref. Thus, virtual comparator speed is maximized. Second, input voltage errors are cancelled. The mid-point transition detection threshold occurs when Vin is approximately equal to Vref. Third, RC is independent of Vin. RC modifies look ahead reference signal Vx with respect to Vref. If Vin has a positive slope, Vx is less than Vref, so the comparator transition coincides with the crossing time. Alternatively, if Vin has a negative slope, Vx is greater than Vref, so the comparator transition again coincides with the crossing time. Finally, RC tracks comparator delay Td over process variations. This is because Td is proportional to $C_{OUT}/I_{BIAS}$, where $C_{OUT}$ is the output capacitance of comparator 406 and $I_{BIAS}$ is the bias current of comparator 406. Since $I_{BIAS}$ is preferably proportional to a bandgap reference voltage divided by resistor R, Td and RC track each other.

Figure 7:
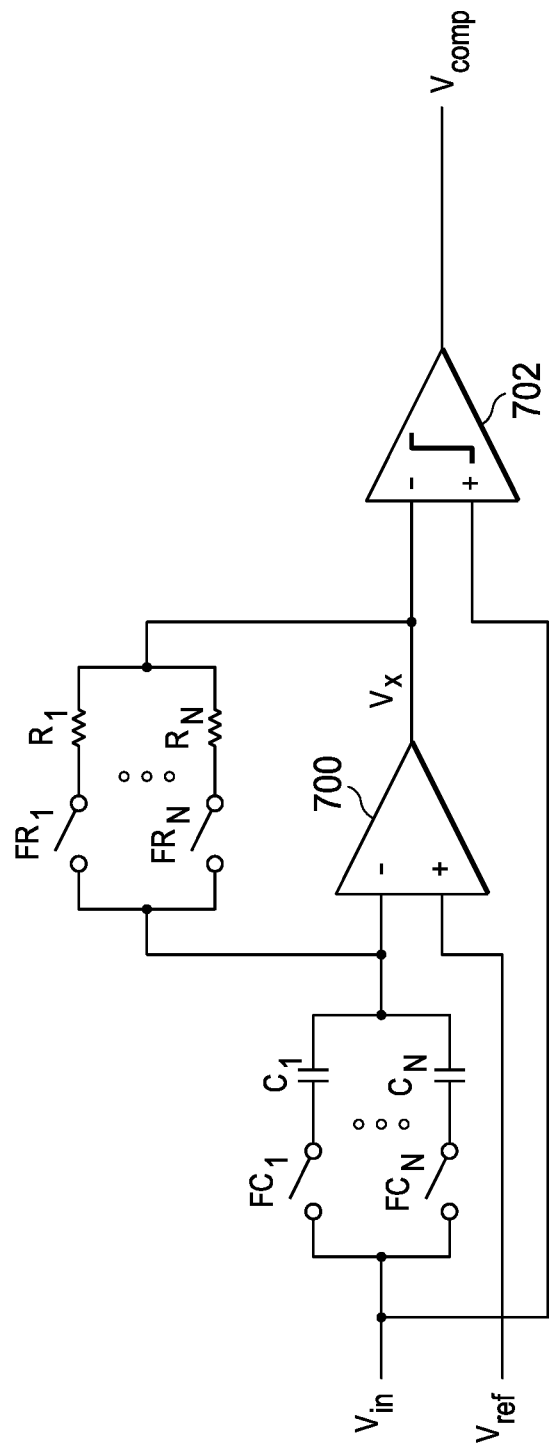
FIG. 7 is a schematic diagram of another embodiment of a continuous time comparator circuit of the present invention.

FIG. 7 is a schematic diagram of another embodiment of a continuous time comparator circuit of the present invention. The comparator circuit includes an amplifier 700 coupled to receive a reference signal Vref at a positive input terminal. A capacitor array $C_1$ through $C_N$ selectively couples input signal Vin to a negative input terminal of amplifier 700. Capacitors $C_1$ through $C_N$ are selectively programmed by respective switching devices $FC_1$ through $FC_N$ to trim the total capacitance value of the capacitor array. Capacitors $C_1$ through $C_N$ may be of equal value, linearly related, binary weighted or of any suitable values. Resistor array $R_1$ through $R_N$ selectively couples the output terminal and the negative input terminal of comparator 700. Resistors $R_1$ through $R_N$ are selectively programmed by respective switching devices $FR_1$ through $FR_N$ to trim the total resistance value of the resistor array. Resistors $R_1$ through $R_N$ may be of equal value, linearly related, binary weighted or of any suitable values. Switching devices $FC_1$ through $FC_N$ and $FR_1$ through $FR_N$ are preferably efuses or antifuses as are known in the art. Amplifier 700 produces a look ahead reference signal Vx that is applied to a negative input terminal of a second comparator 702. A positive input terminal of comparator 702 is coupled to receive input signal Vin. Comparator 702 produces output signal Vcomp in response to input signal Vin and look ahead reference signal Vx.

The delay compensated comparator circuit of FIG. 7 includes all the previously discussed advantages of the delay compensated comparator circuit of FIG. 4. In addition, the circuit of FIG. 7 is configured to facilitate both resistor R and capacitor C trimming by either efuse or antifuse programming.

Still further, while numerous examples have thus been provided, one skilled in the art should recognize that various modifications, substitutions, or alterations may be made to the described embodiments while still falling within the inventive scope as defined by the following claims. For example, although RC values have been used to replicate comparator delay Td, other circuit elements that track Td may also be used. Other combinations will be readily apparent to one of ordinary skill in the art having access to the instant specification.

The invention claimed is:

1. A circuit, comprising:
   an input voltage terminal;
   a reference voltage terminal;
   a capacitor having first and second terminals, the first terminal coupled to the input voltage terminal;
   an amplifier circuit having first and second input terminals, and a first output terminal, the first input terminal coupled to the second terminal of the capacitor, the second input terminal coupled to the reference voltage terminal;
   a resistor coupled between the first output terminal and the second input terminal; and
   a comparator circuit having third and fourth input terminals and a second output terminal, the third input terminal directly coupled to the input voltage terminal, the fourth input terminal directly coupled to the first output terminal and the resistor.

2. The circuit of claim 1, wherein the amplifier circuit is configured to produce a compensated reference signal.

3. The circuit of claim 2, wherein the compensated reference signal has a voltage less than a voltage of a reference signal received from the reference voltage input terminal when an input signal received from the input voltage terminal has a positive rate of change with respect to time.

4. The circuit of claim 2, wherein the compensated reference signal has a voltage greater than a voltage of a reference signal received from the reference voltage input terminal when an input signal received from the input voltage terminal has a negative rate of change with respect to time.

5. The circuit of claim 1, wherein the comparator circuit produces a compensated output signal at the second output terminal.

6. The circuit of claim 5, wherein compensated output signal is greater than or equal to a detection threshold when an input signal received from the input voltage terminal is equal to a reference signal received from the reference voltage input terminal.

7. The circuit of claim 1, wherein the resistor and capacitor values are independent of a rate of change of an input signal received from the input voltage terminal with respect to time.

8. The circuit of claim 1, wherein the comparator circuit is a continuous time comparator circuit.

9. A circuit, comprising:
- an amplifier circuit having a first input terminal coupled to receive a reference signal and having a second input terminal and a first output terminal;
- a capacitor circuit arranged to selectively apply an input signal to the second input terminal;
- a resistor circuit arranged to selectively couple the first output terminal and the second input terminal; and
- a first comparator circuit having a third input terminal coupled to receive the input signal, having a fourth input terminal coupled to the first output terminal, and having a second output terminal.

10. The circuit of claim 9, wherein the capacitor circuit comprises a plurality of parallel capacitor circuits, each capacitor circuit comprising a respective capacitor and series-connected fuse.

11. The circuit of claim 9, wherein the resistor circuit comprises a plurality of parallel resistor circuits, each resistor circuit comprising a respective resistor and series-connected fuse.

12. The circuit of claim 9, wherein the first comparator circuit produces a compensated reference signal.

13. The circuit of claim 12, wherein compensated reference signal is less than the reference signal when the input signal has a positive rate of change with respect to time.

14. The circuit of claim 12, wherein compensated reference signal is greater than the reference signal when the input signal has a negative rate of change with respect to time.

* * * * *